US012677712B2

(12) United States Patent
Niu et al.

(10) Patent No.: US 12,677,712 B2
(45) Date of Patent: Jul. 7, 2026

(54) SEMICONDUCTOR PACKAGE HAVING MULTIPLE REDISTRIBUTION LAYERS AND METHOD OF MAKING THE SAME

(71) Applicant: ALPHA AND OMEGA SEMICONDUCTOR INTERNATIONAL LP, Toronto (CA)

(72) Inventors: Zhiqiang Niu, Santa Clara, CA (US); Rhys Philbrick, Los Gatos, CA (US); Long-Ching Wang, Cupertino, CA (US); Chunya Wen, Santa Clara, CA (US); Yan Xun Xue, Los Gatos, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 393 days.

(21) Appl. No.: 18/213,170

(22) Filed: Jun. 22, 2023

(65) Prior Publication Data
US 2024/0429140 A1     Dec. 26, 2024

(51) Int. Cl.
*H10W 90/00*     (2026.01)
*H10W 20/20*     (2026.01)
(Continued)

(52) U.S. Cl.
CPC ......... *H10W 90/701* (2026.01); *H10W 20/20* (2026.01); *H10W 70/614* (2026.01);
(Continued)

(58) Field of Classification Search
CPC ........... H01L 23/49811; H01L 23/3121; H01L 23/481; H01L 23/5389; H01L 24/27;

H01L 24/32; H01L 24/92; H01L 25/0655; H01L 2224/3223; H01L 2224/32235; H01L 2224/92142; H01L 2225/06541; H01L 2924/13091; H01L 2924/1811; H01L 2924/183; H01L 23/3107; H01L 24/19; H01L 24/20; H01L 25/16; H01L 21/56; H01L 21/60; H01L 23/485; H10W 90/701; H10W 20/20; H10W 70/614; H10W 72/013; H10W 74/114; H10W 90/00; H10W 72/073; H10W 74/00; H10W 74/127; H10W 90/297; H10W 90/734; H10W 70/09; H10W 70/60;
(Continued)

(56) References Cited

U.S. PATENT DOCUMENTS

2019/0371731 A1* 12/2019 Kang ....................... H01L 25/16
2022/0375902 A1* 11/2022 Fay ......................... H01L 24/08

* cited by examiner

*Primary Examiner* — Patricia D Valenzuela
(74) *Attorney, Agent, or Firm* — Chen-Chi Lin

(57) ABSTRACT

A semiconductor package comprises two or more chips, a first molding layer, a second molding layer, a third molding layer, a fourth molding layer, a bottom redistribution layer (RDL), a middle RDL, and a top RDL. The two or more chips comprise a first chip and a second chip. The top RDL comprises a first copper plate and a second copper plate. A plurality of vias electrically connect the second copper plate to the second chip. A method comprises the steps of preparing two or more chips; forming a chip-level molding layer; forming a middle RDL; forming a lower-level molding layer; forming a bottom RDL; forming a lowest-level molding layer; forming a top RDL; and forming a top-level molding layer so as to fabricate a semiconductor package.

20 Claims, 12 Drawing Sheets

(51) Int. Cl.
    *H10W 70/60*         (2026.01)
    *H10W 72/00*         (2026.01)
    *H10W 74/10*         (2026.01)
    *H10W 74/00*         (2026.01)
    *H10W 90/20*         (2026.01)

(52) U.S. Cl.
    CPC ........ *H10W 72/013* (2026.01); *H10W 74/114*
        (2026.01); *H10W 90/00* (2026.01); *H10W*
        *72/073* (2026.01); *H10W 74/00* (2026.01);
        *H10W 74/127* (2026.01); *H10W 90/297*
        (2026.01); *H10W 90/734* (2026.01)

(58) Field of Classification Search
    CPC . H10W 74/111; H10W 20/40; H10W 72/071;
        H10W 74/01
    See application file for complete search history.

331

333

335

340

342

344

346

400

| Preparing two or more chips. | 402 |

| Forming a chip-level molding layer. | 404 |

| Forming a middle RDL. | 406 |

| Forming a lower-level molding layer. | 408 |

| Forming a bottom RDL. | 410 |

| Forming a lowest-level molding layer. | 412 |

| Drilling via holes. | 414 |

| Forming a top RDL. | 416 |

| Forming a top-level molding layer. | 418 |

520

516

540

514

521

512

571

573

580

582

586

SEMICONDUCTOR PACKAGE HAVING MULTIPLE REDISTRIBUTION LAYERS AND METHOD OF MAKING THE SAME

FIELD OF THE INVENTION

This invention relates generally to a semiconductor package having multiple redistribution layer and a method of making the same. More particularly, the present invention relates to a semiconductor package having increased chip-surface to package-surface ratio.

BACKGROUND OF THE INVENTION

It is challenging to reduce a size of a semiconductor package while improving or maintaining heat dissipation capability, reliability performance, efficiency, and power density. In order to maintain thermal performance and efficiency, a size of convention monolithic quad flat no-lead (QFN) package cannot be reduced.

The advantages of instant disclosure include improved efficiency, reduced package size, reduced cost, more compact footprint, and improved thermal performance. The chip-surface to package-surface ratio is at least 67%.

SUMMARY OF THE INVENTION

The present invention discloses a semiconductor package comprising two or more chips, a first molding layer, a second molding layer, a third molding layer, a fourth molding layer, a bottom redistribution layer (RDL), a middle RDL, and a top RDL. The two or more chips comprise a first chip and a second chip. The top RDL comprises a first copper plate and a second copper plate. A plurality of vias electrically connect the second copper plate to the second chip.

A method for fabricating a semiconductor package is also disclosed. The method comprises the steps of preparing two or more chips; forming a chip-level molding layer; forming a middle RDL; forming a lower-level molding layer; forming a bottom RDL; forming a lowest-level molding layer; forming a top RDL; and forming a top-level molding layer.

Each of FIGS. 3A, 3B, 3C, 3D, 3E, 3F, 3G, and 3H is a top view of a respective level of the semiconductor package of FIG. 2A in examples of the present disclosure.

Figure 4:
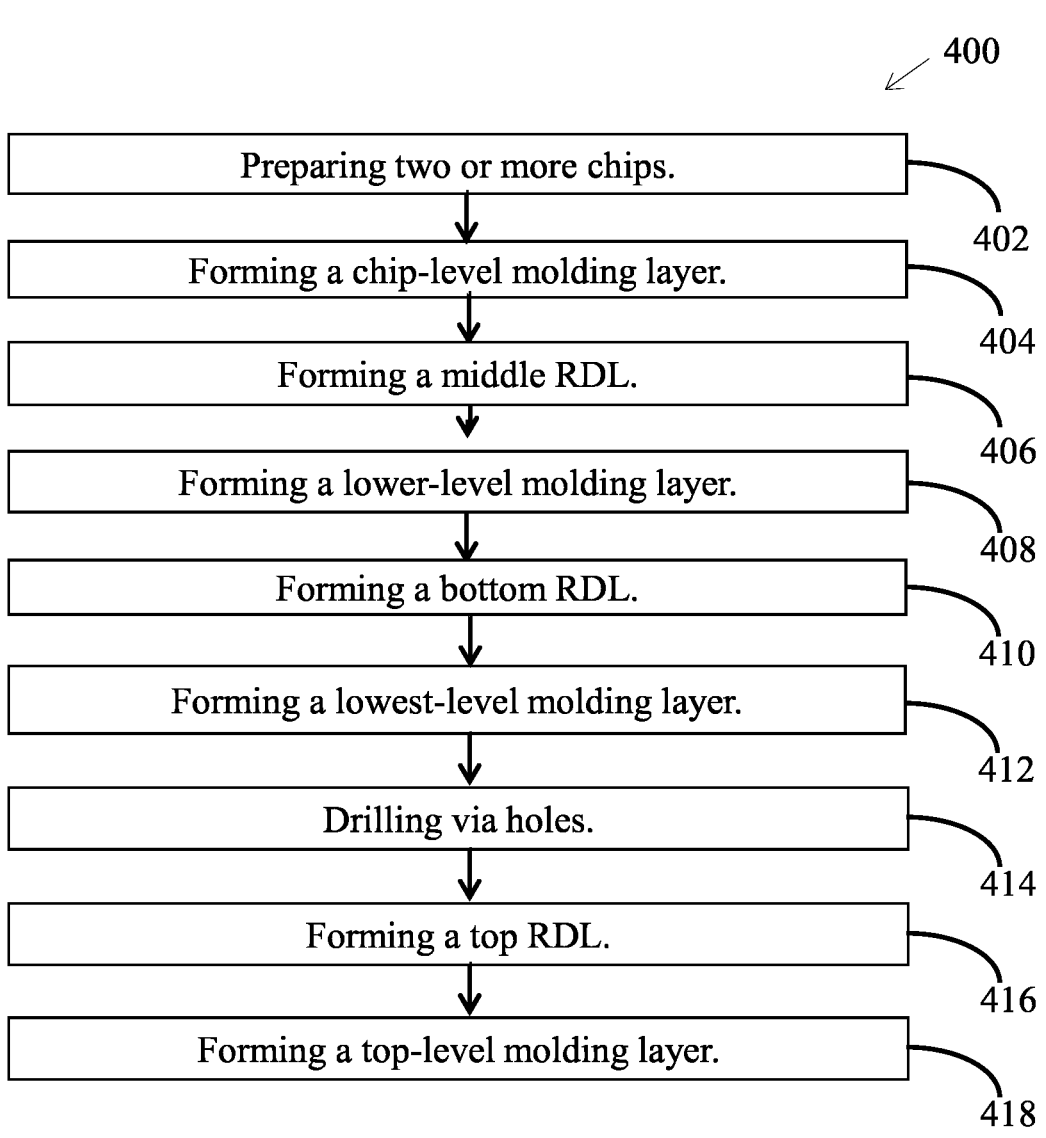

FIG. 4 is a flowchart of a process to fabricate a semiconductor device in examples of the present disclosure.

FIGS. 5A, 5B, 5C, 5D, 5E, 5F, 5G, 5H, and 5I show the steps of the process to fabricate a semiconductor device in examples of the present disclosure.

DETAILED DESCRIPTION OF THE INVENTION

Figure 1A:
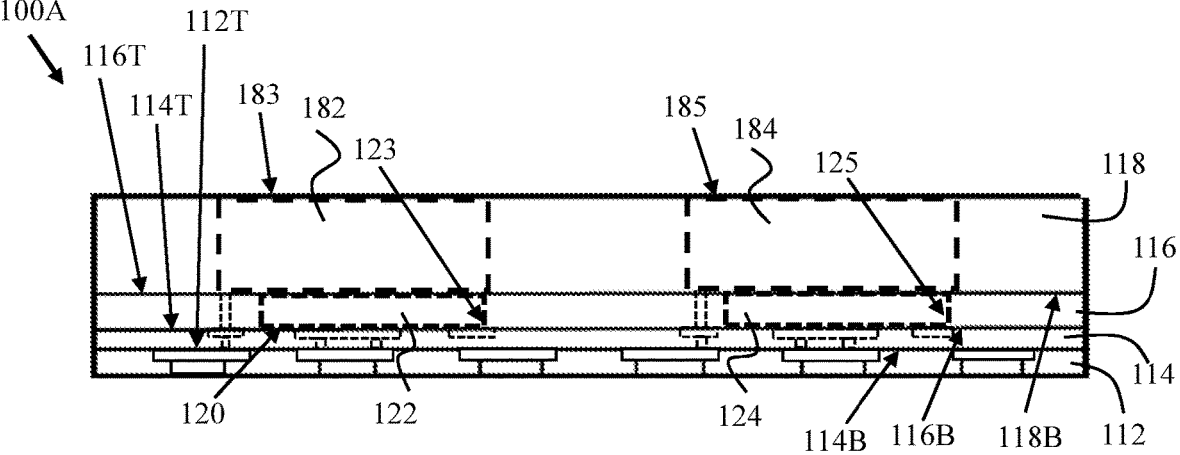
FIG. 1A is a side view of a semiconductor package in examples of the present disclosure.
Figure 1B:
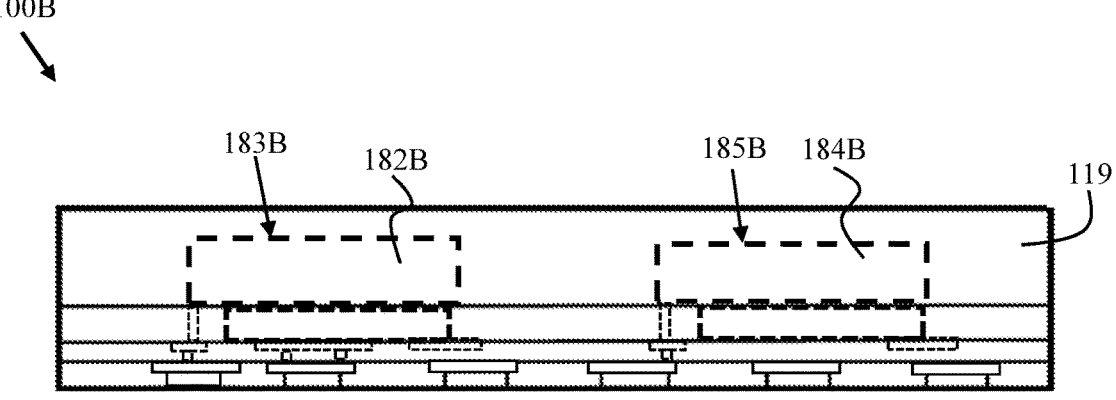
FIG. 1B is a side view of another semiconductor package in examples of the present disclosure.

FIG. 1A is a side view of a semiconductor package 100A in examples of the present disclosure. FIG. 1B is a side view of a semiconductor package 100B in examples of the present disclosure. The semiconductor package comprises two or more chips 120, a first molding layer 112, a second molding layer 114, a third molding layer 116, and a fourth molding layer 118. The semiconductor package further comprises a bottom redistribution layer (RDL) 320 of FIG. 3B embedded in the first molding layer 112 with a top surface of the bottom RDL 320 interfacing the second molding layer 114, a middle RDL 340 of FIG. 3D embedded in the second molding layer 114 with a top surface of the middle RDL 340 interfacing the third molding layer 116, and a top RDL 380 of FIG. 3G embedded in the fourth molding layer 118 with a bottom surface of the top RDL 380 interfacing the third molding layer 116. The two or more chips 120 are embedded in the third molding layer 116 with a respective front surface of each of the two or more chips 120 interfacing the second molding layer 114 and a respective back surface of the two or more chips 120 interfacing the fourth molding layer 118. A bottom surface of the bottom RDL 320 is exposed from a bottom surface of the first molding layer 112 to provide pin connections of the semiconductor package. In one example, the semiconductor package 100A is a DC-DC buck converter. In another example, the semiconductor package 100A is a quad flat no-lead (QFN) package.

The two or more chips comprises a first chip 122 and a second chip 124. The first chip 122 and the second chip 124 are shown in dashed lines because they are surrounded by the third molding layer 116 at each edge. A bottom surface 114B of the second molding layer 114 directly contacts a top surface 112T of the first molding layer 112. A bottom surface 116B of the third molding layer 116 directly contacts a top surface 114T of the second molding layer 114. A bottom surface 118B of the fourth molding layer 118 directly contacts a top surface 116T of the third molding layer 116. In one example, each of the first molding layer 112, the second molding layer 114, the third molding layer 116, and the fourth molding layer 118 comprises a same molding compound with a same filler. In another example, each of the first molding layer 112, the second molding layer 114, the third molding layer 116, and the fourth molding layer 118 comprises different filler material from other molding layers. In still another example, each of the first molding layer 112, the second molding layer 114, the third molding layer 116, and the fourth molding layer 118 comprises a same molding compound with a same filler, but with different percentage amount of filler from other molding layers.

Figure 3A:
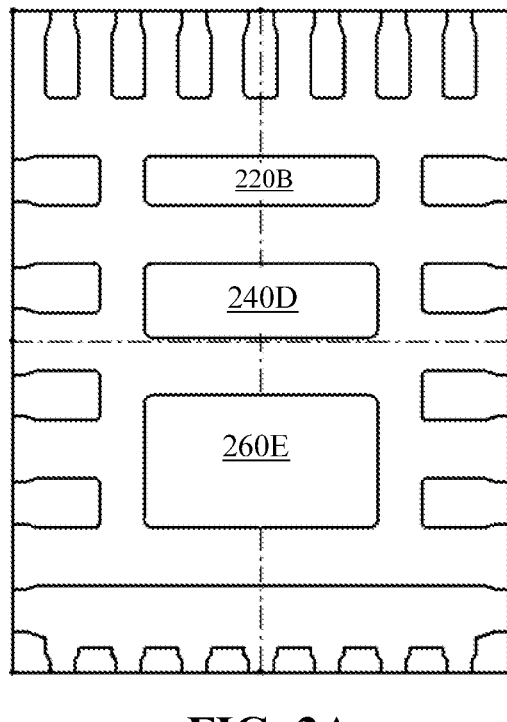
Figure 3B:
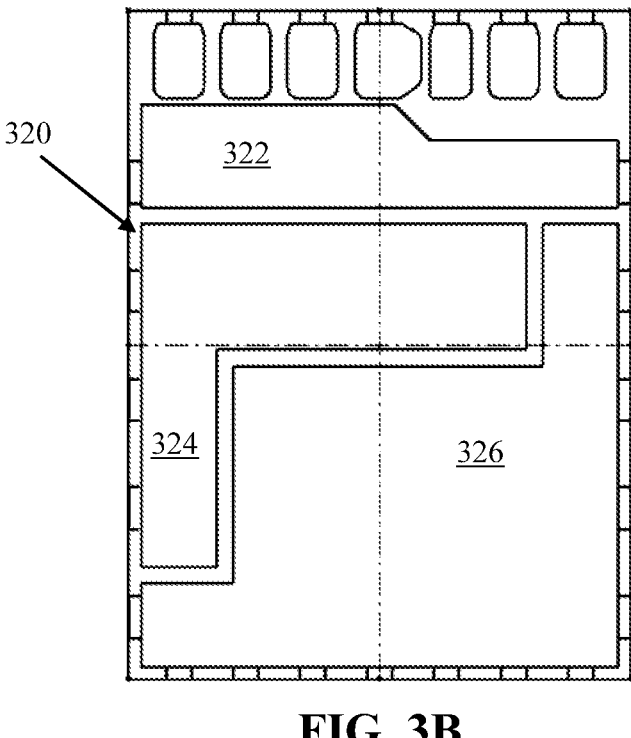
Figure 3C:
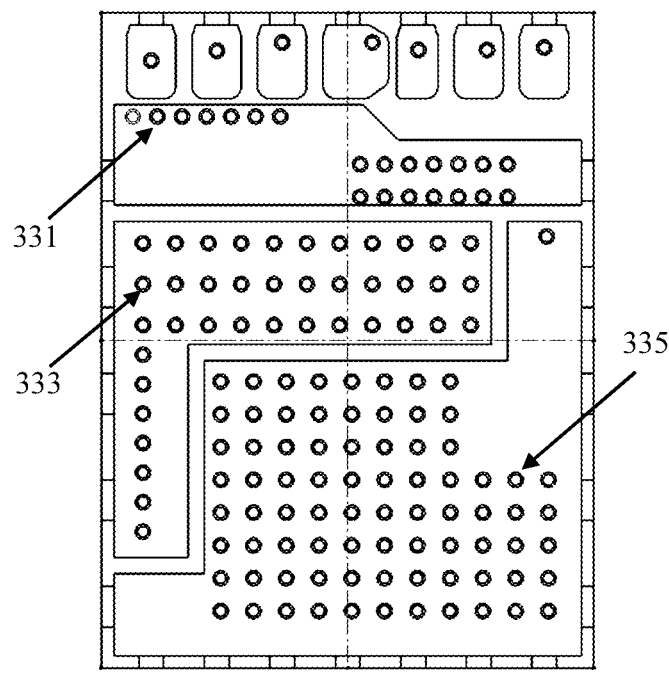
Figure 3D:
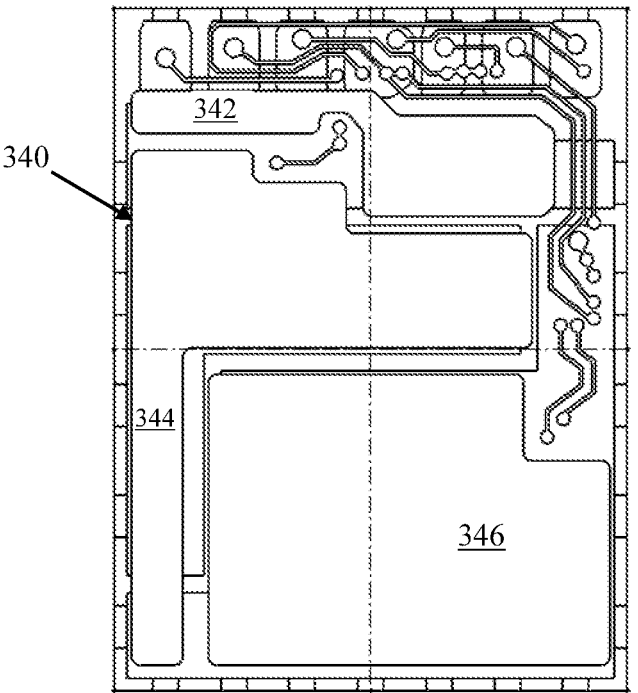
Figure 3E:
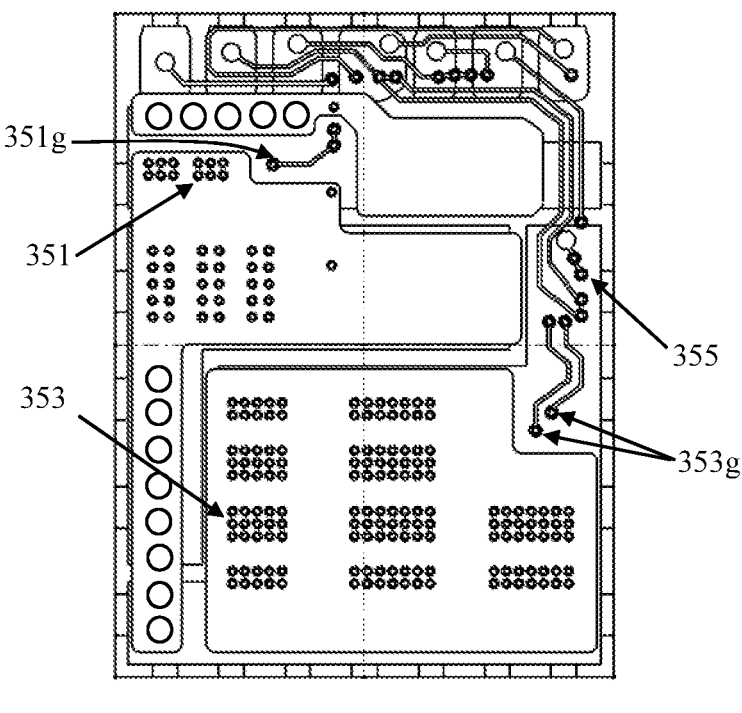

A bottom surface of the bottom RDL 320 of FIG. 3B is exposed from a bottom surface of the first molding layer 112, and a top surface of the bottom RDL 320 of FIG. 3B interfaces the second molding layer 114. The bottom RDL 320 includes a bottom half-etched portion enclosed inside the first molding layer 112, therefore, a total area of the bottom surface of the bottom RDL 320 exposed from the bottom of the first molding layer 112 is less than a total area of the top surface of the bottom RDL 320 interfacing the second molding layer 114 and a plurality of bottom vias through the second molding layer 114. A bottom surface of the middle RDL 340 of FIG. 3D directly contacts the second molding layer 114 and enclosed inside the second molding layer 114, and a top surface of the middle RDL 340 of FIG. 3D interfaces the third molding layer 116. A bottom surface of the top RDL 380 of FIG. 3G is above and interfaces the third molding layer 116. In the semiconductor package 100A of FIG. 1A, a top surface of the top RDL 380 is exposed and coplanar to a top surface of the fourth molding layer 118. For the semiconductor package 100B of FIG. 1B, a top surface of the top RDL 380 of FIG. 3G directly contacts the fourth molding layer 118 and being enclosed therein.

Each sidewall of a plurality of sidewalls 123 of the first chip 122 directly contacts the third molding layer 116. Each sidewall of a plurality of sidewalls 125 of the second chip 124 directly contacts the third molding layer 116.

Figure 3F:
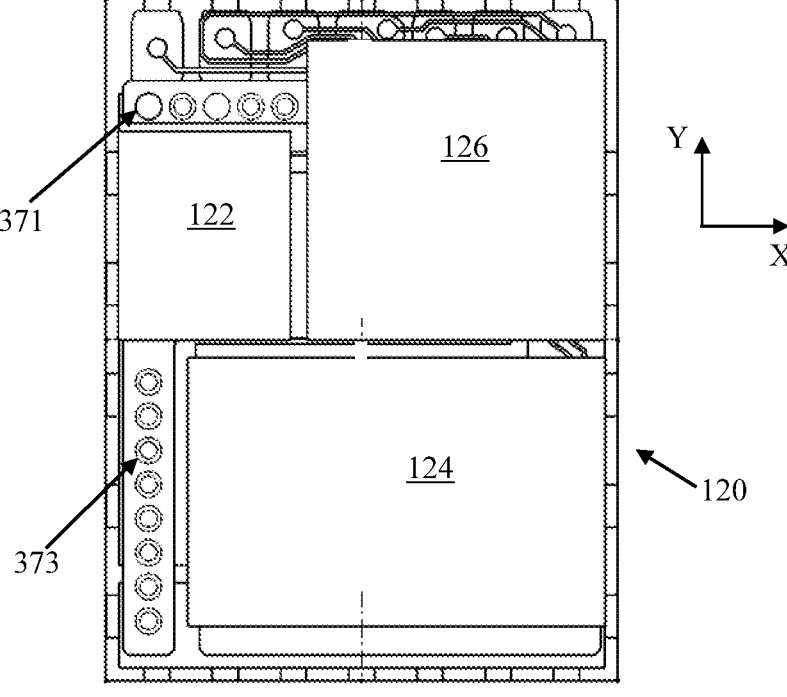
Figure 3G:
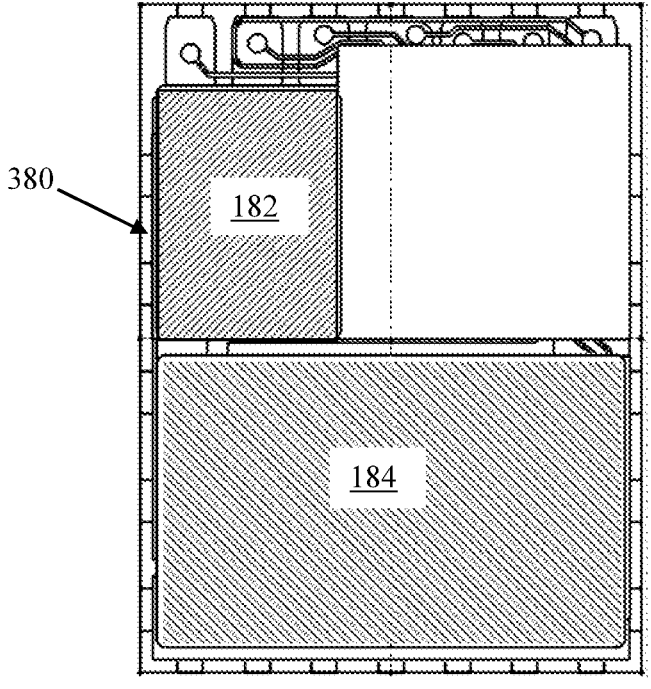

In examples of the present disclosure, the two or more chips 120 further comprises a third chip 126 of FIG. 3F. A back surface of the third chip 126 of FIG. 3F directly contacts the fourth molding layer 118.

The top RDL 380 of FIG. 3G comprises a first copper plate 182 and a second copper plate 184. In the semiconductor package 100A of FIG. 1A, a top surface 183 of the first copper plate 182 is exposed from the fourth molding layer 118. A top surface 185 of the second copper plate 184 is exposed from the fourth molding layer 118. In the semiconductor package 100B of FIG. 1B, a top surface 183B of the first copper plate 182B is covered by the fourth molding layer 119. A top surface 185B of the second copper plate 184B is covered by the fourth molding layer 119.

Figure 2:
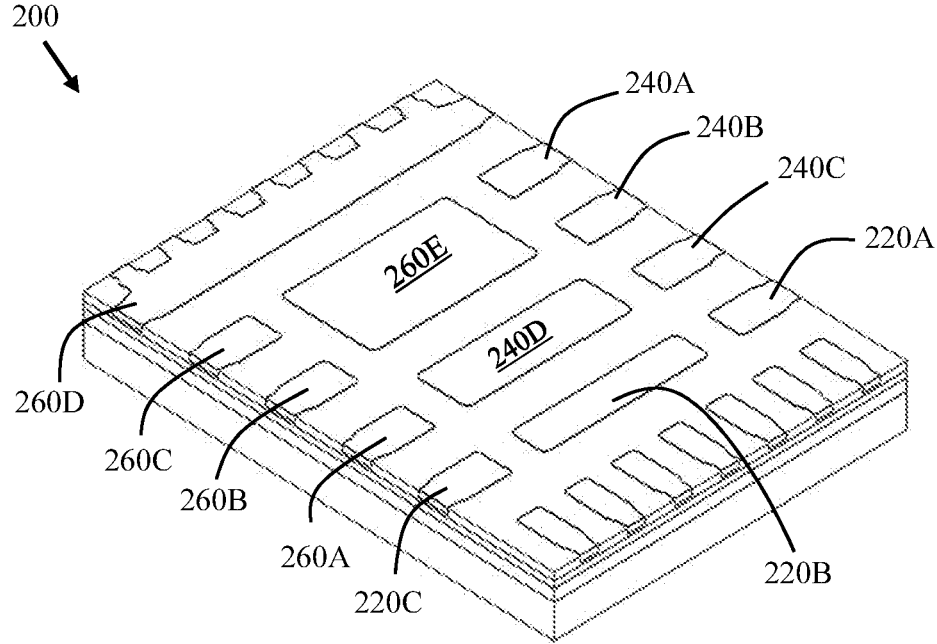
FIG. 2 is a bottom perspective view a semiconductor package in examples of the present disclosure.

FIG. 2 is a bottom perspective view a semiconductor package 200 in examples of the present disclosure. The semiconductor package 200 comprises a plurality of integrated circuit (IC) control pins along a first edge of the semiconductor package and a ground pin-out 260D along a second edge opposite the first edge. Additional ground pins include a central ground pin-out 260E in a rectangular shape in parallel and adjacent to ground pin-out 260D, a plurality of ground pin-outs 260A, 260B, and 260C along a third edge perpendicular to the first and second edge. A plurality of power input pins includes a central power pin Vin pin-out 220B in a rectangular shape, a plurality of Vin pin-outs 220A, and 220C, substantially aligned and paralleled to a first edge, are disposed adjacent to the plurality of IC control pins. A plurality of switching pins includes a central switching pin SW pin-out 240D in a rectangular shape disposed between central power pin Vin pin-out 220B and central ground pin-out 260E, a plurality of SW pin-outs 240A, 240B, and SW pin-out 240C along a fourth edge opposite the third edge.

Each of FIGS. 3A, 3B, 3C, 3D, 3E, 3F, 3G, and 3H is a planar view of a respective layer bottom or top surface of the semiconductor package of FIG. 2 in examples of the present disclosure. The layers are from bottom to top (except for vias) as the sequence of FIGS. 3A, 3B, 3C. 3D, 3E, 3F, 3G, and 3H presented.

FIG. 3A shows the bottom surface of the first molding layer 112 with bottom RDL 320, and bottom pin-outs pattern including central power input Vin pin-out 220B, SW pin-out 240D, Ground pin-out 260E and pluralities of edge pins corresponding to FIG. 2 exposed from the bottom of the first molding layer 112. FIG. 3B shows the top surface of the first molding layer 112 with bottom RDL 320 including a first bottom copper connector 322, a second bottom copper connector 324, a third bottom copper connector 326, and a plurality of IC control pins along the first edge. Each of the bottom copper connectors and the plurality of IC control pins includes a half-etched bottom portion enclosed inside the first molding layer 112 with the none etched portion exposed from the first molding layer 112 so as to function as a respective connection pin. Power input pins Vin pin-out 220A, Vin pin-out 220B, and Vin pin-out 220C are integral and interconnected through the first bottom copper connector 322; SW pin-out 240A. SW pin-out 240B, SW pin-out 240C, SW pin-out 240D are integral and interconnected through the second bottom copper connector 324; Ground pin-out 260B, Ground pin-out 260C, Ground pin-out 260D, and Ground pin-out 260E are integral and interconnected through the third bottom copper connector 326. FIG. 3C shows the bottom surface of the second molding layer 114 overlaying bottom RDL 320 in FIG. 3B with a first plurality of bottom vias 331 aligned with the first bottom copper connector 322, a second plurality of bottom vias 333 aligned with the second bottom copper connector 324, and a third plurality of bottom vias 335 aligned with the third bottom copper connector 326. FIG. 3D shows the top surface of the second molding layer 114 overlaying bottom RDL 320 in FIG. 3B with the middle RDL 340 including a first middle copper connector 342, a second middle copper connector 344, a third middle copper connector 346, and a plurality of connection traces. The first plurality of bottom vias 331 electrically connect the first middle copper connector 342 to the first bottom copper connector 322, the second plurality of bottom vias 333 electrically connect the second middle copper connector 344 to the second bottom copper connector 324, the third plurality of bottom vias 335 electrically connect the third middle copper connector 346 to the third bottom copper connector 326.

FIG. 3E shows the bottom surface of the third molding layer 116 overlaying the bottom RDL 320 and the middle RDL 340 of FIG. 3D. Each of the two or more chips 120 includes a plurality of middle vias 351 on a front surface of the semiconductor chip exposed on the bottom surface of the third molding layer 116. FIG. 1A and FIG. 3B show the top surface of the third molding layer 116 overlaying the bottom RDL 320 and the middle RDL 340 of FIG. 3D with a back surface of each chip of the two or more chips 120 exposed on the top surface of the third molding layer 116. In one example, FIG. 3F shows two or more chips 120 comprising a first chip 122, a second chip 124, and a third chip 126. In examples of the present disclosure, the first chip 122 is a metal-oxide-semiconductor field-effect transistor (MOS-FET) chip. The second chip 124 is a MOSFET chip. The third chip 126 is an IC chip. Alternatively, the first chip and the third IC chip may be integrated as one chip. As shown in FIG. 3E, the first chip 122 incudes a first plurality of middle vias 351 connected to the source electrode of the first chip 122 and one or more gate vias 351g connected to the gate electrode of the first chip 122 at the front surface of the first chip 122. The second chip 124 incudes a second plurality of middle vias 353 connected to the source electrode of the second chip 124 and one or more gate vias 353g connected to the gate electrode of the first chip 122 at the front surface of the second chip 124. The third chip 126 includes a third plurality of contact vias 355 electrically connected to a plurality of IC pads. The contact vias 255 includes a first gate drive vias connected to the gate vias 351g of the first chip 122 through a first conduction trace and a second gate drive vias connected to the gate vias 353g of the second chip 124 through a second conduction trace.

FIG. 3E and FIG. 3F show a first plurality of top vias 371 aligned with the first middle copper connector 342 and a second plurality of top vias 373 aligned with the second middle copper connector 344 formed through the third molding layer 116. The first plurality of top vias 371 extend along a first direction (X axis). The second plurality of top vias 373 extend along a second direction (Y axis) perpendicular to the first direction (X axis). The first plurality of top vias 371 electrically connects to the power input pins through the first middle copper connector 342 of FIG. 3D, the first plurality of bottom vias 331 of FIG. 3C, and the first bottom copper connector 322 of FIG. 3B. The second plurality of top vias 373 electrically connects to the SW pins through the third middle copper connector 346 of FIG. 3D, the second plurality of bottom vias 333 of FIG. 3C, and the third bottom copper connector 326 of FIG. 3B.

Figure 3H:
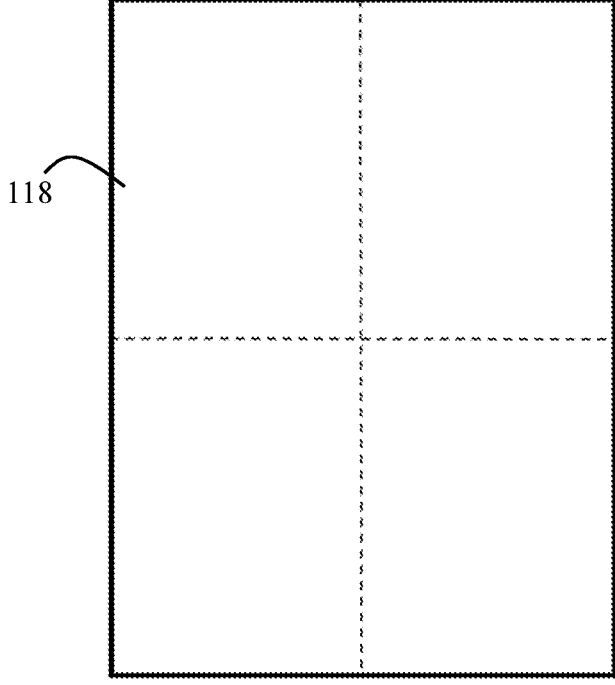

FIG. 3G shows the bottom surface of the fourth molding layer with the top RDL 380 including a first copper plate 182 and a second copper plate 184. The first copper plate 182 covers substantially both the entire back surface of first chip 122 and the first plurality of top vias 371. The drain electrode of the first chip 122 is thus connected to the power input pins. The second copper plate 184 covers substantially both the entire back surface of second chip 124 and the second plurality of top vias 373. The drain electrode of the second chip 124 is thus connected to the SW pin. In one example, FIG. 3H shows the top surface of the fourth molding layer 118 in FIG. 1B. In another example, the top surface of the fourth molding layer 118 may be ground to expose the top surface of first cooper plate 182 and the top surface of the second cooper plate 184 as shown in FIG. 1A.

A sum of a back surface area of the first chip 122 of FIG. 3F, a back surface area of the second chip 124 of FIG. 3F, and a back surface area of the third chip 126 of FIG. 3F is at least 67% of a top surface area of the semiconductor package 100A of FIG. 1A.

FIG. 4 is a flowchart of a process 400 to fabricate a semiconductor device in examples of the present disclosure. The process 400 may start from block 402. FIGS. 5A-5I show top views of the corresponding steps. For simplicity, only members of one semiconductor package is shown in FIGS. 5A-5I. A singulation process may be applied after the step shown in FIG. 5I.

Figure 5A:
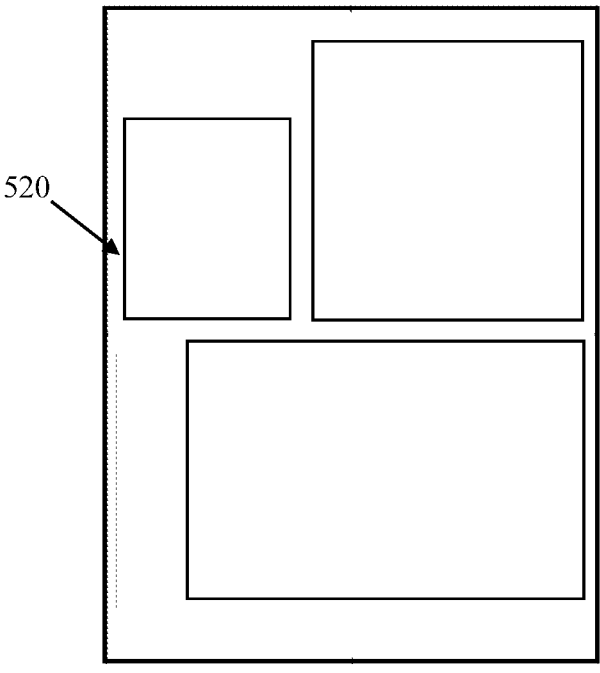

In block 402, two or more semiconductor chips 520 are prepared from two or more semiconductor wafers. In one example, the two or more wafers include a first MOSFET wafer, a second MOSFET wafer, and an IC wafer. Each of the first and second MOSFET wafers includes a source electrode and a gate electrode on a respective front surface, and a drain region extending to a respective back surface of each of the first and second MOSFET wafers. The IC wafer includes a plurality of electrodes on the front surface of the IC wafer. The preparation process starts with a wafer mold film in the range of 10-40 microns applied onto the front surface of each of the two or more MOSFET wafers. The wafer mold film covers the electrodes on each front surface of the two or more MOSFET wafers. Apply laser drilling to form vias in the diameter of 15-200 microns through the wafer mold film to expose the electrodes on each front surface of the two or more MOSFET wafers. Apply backside grinding to reduce the thickness of the two or more MOS-FET wafers from 760 microns to a desired thickness between 50-300 microns. Each thinned wafer is then diced into a plurality of semiconductor chips with front electrodes exposed from vias or vias arrays through the wafer mold film. Referring now to FIG. 5A (a top view), a first MOSFET chip 520A from the first MOSFET wafer, a second MOSFET chip 520B from the second MOSFET wafer, and an IC chip 520C from the IC wafer are placed on a first carrier (not shown) with front electrodes face down. The two or more semiconductor chips are placed on the first carrier with a space of 50-200 microns between one another. Alternatively, the first MOSFET chip and the second MOSFET chip may be formed on a same MOSFET wafer. Block 402 may be followed by block 404.

Figure 5B:
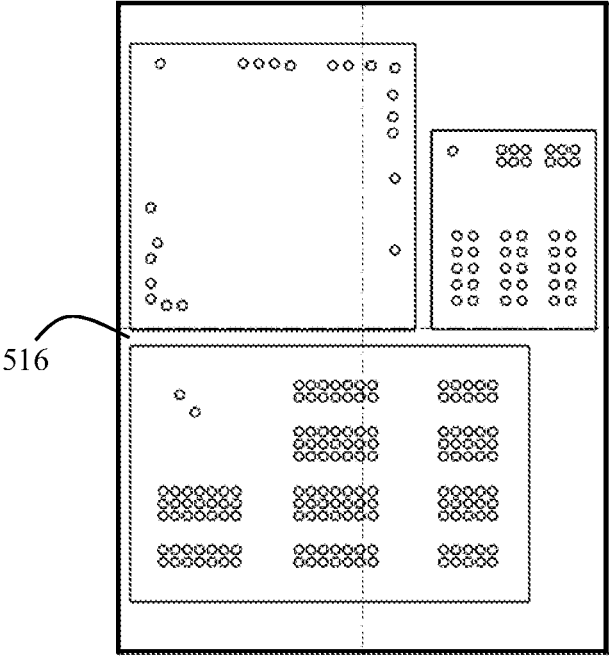

In block 404, a chip-level molding layer 516 is formed. The chip-level molding layer 516 filling the spaces between the chips thus surrounds all sidewalls of the semiconductor chips, with thickness of 50-100 microns above the semiconductor chips. An optional grinding process may be applied to smooth the molding layer surface or to reduce the chip-level molding layer to the back surface of the chips. The chip-level molding layer 516 becomes the third molding layer of FIG. 1A after singulation. Referring now to FIG. 5B (a bottom view), the assembly of the semiconductor chips 520 surrounded by the chip-level molding layer 516 is then released from the first carrier in the step of block 402 and then mounted on a second carrier (not shown) with the front surface of the chips facing up. Block 404 may be followed by block 406.

Figure 5C:
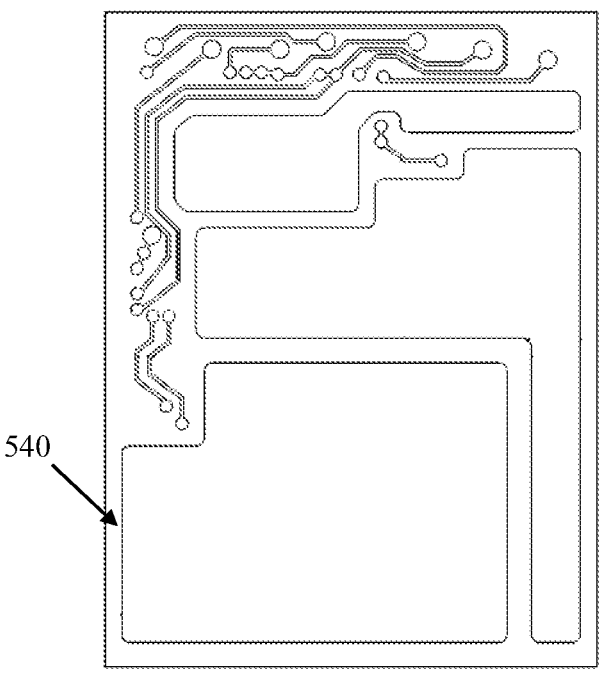

In block 406, referring now to FIG. 5C (a bottom view), a middle RDL 540 having a thickness between 5-40 microns is formed on a front surface of the wafer mold film and the chip-level molding layer 516 surrounding the semiconductor chips 520. Middle RDL 540 may be formed through standard process of applying seed layer, photolithography, copper plating, stripping, and etching. The middle RDL 540 provides electrical connections between the IC chip to the gate electrodes of the first and second MOSFET chips, a large first source area S1 and a large second source area S2 connected to the first MOSFET chip source electrode and the second MOSFET chip source electrode respectively through the vias in the wafer mold film. The first source area S1 overlays the source electrode of the first MOSFET chip and extends beyond the first MOSFET chip to an area adjacent to the second MOSFET chip. The middle RDL 540 also include a power input area Vin extending to an area adjacent to the first MOSFET chip, and a plurality of contact pads at a periphery area of the assembly beyond the IC chip connecting to the IC chip electrodes through a plurality of connection traces. Block 406 may be followed by block 408.

Figure 5D:
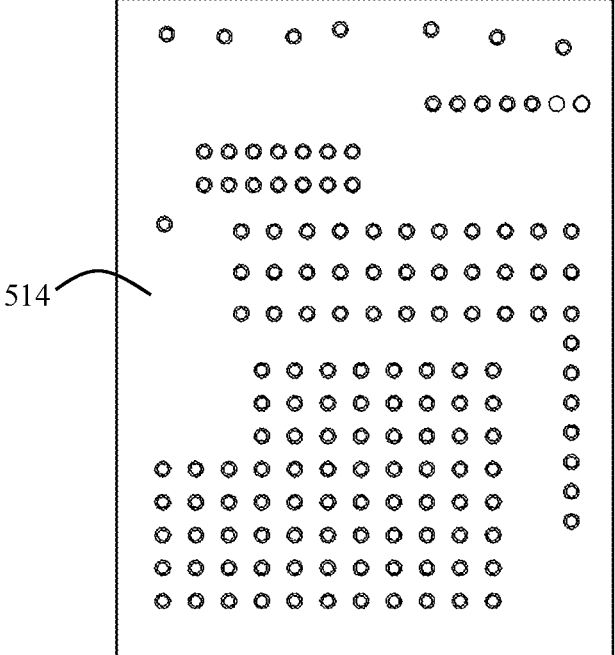

In block 408, referring now to FIG. 5D (a bottom view), a lower-level molding layer 514 is formed overlaying the middle RDL 540. The lower-level molding layer 514 becomes the second molding layer of FIG. 1A after singulation. Apply laser drilling to form vias through the lower-level molding layer 514 to provide connections to the large first source area S1, the large second source area S2, the power input area V'in and the plurality of contact pads at the periphery area of the assembly. Block 408 may be followed by block 410.

Figure 5E:
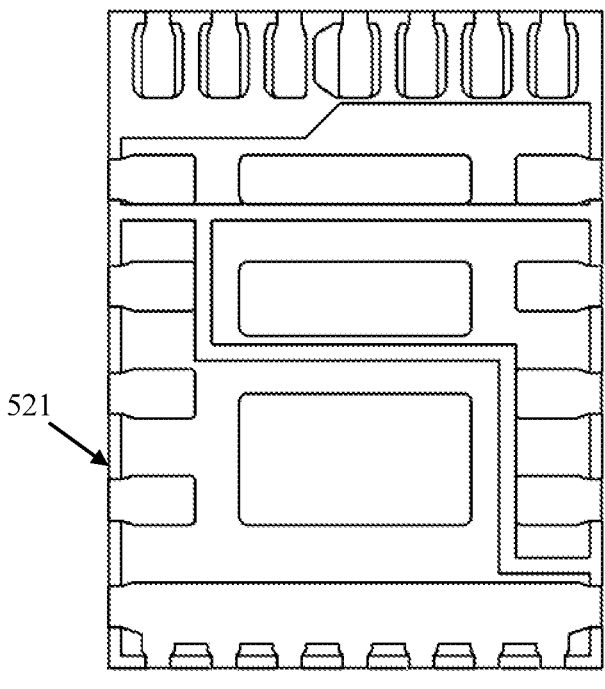

In block 410, referring now to FIG. 5E (a bottom view), a bottom RDL 521 is formed on the lower-level molding layer 514. The bottom RDL 521 may include a large ground area GND, a large switching node area SW, a power input area Vin, and a plurality of contact pin outs at the periphery area of the assembly. The bottom RDL 521 may have a thickness of 40-150 microns, with half-etched areas recess from top surfaces of central portions of the large ground area GND, the large switching node area SW, the power input area Vin and the plurality of contact pin outs. Bottom RDL 521 may be formed through standard process of applying seed layer, photolithography, copper plating, stripping, and etching. Bottom RDL 521 provides connections to the large first source area S1 and the large second source area S2 through vias in the lower-level molding layer 514, as well as pin outs for the assembly. Block 410 may be followed by block 412.

Figure 5F:
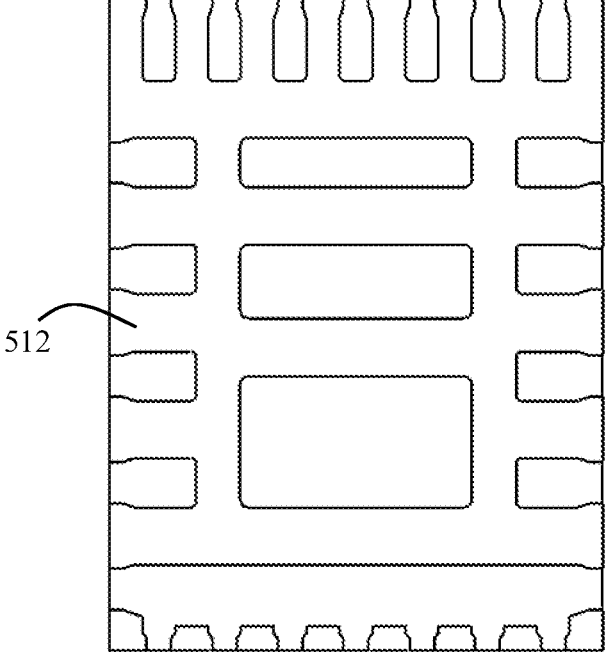

In block 412, referring now to FIG. 5F (a bottom view), a lowest-level molding layer 512 is formed overlaying the bottom RDL 521. The lowest-level molding layer 512 becomes the first molding layer of FIG. 1A after singulation. A backside grinding process reduce the thickness of the lowest-level molding layer 512 to expose the top surfaces of central portions of the large ground area GND, the large switching node area SW, the power input area Vin and the plurality of contact pin outs. The exposed surface of bottom RDL 521 is then protected from oxidation by applying electroless plating to form Ni/Au coating layer. Block 412 may be followed by block 414.

Figure 5G:
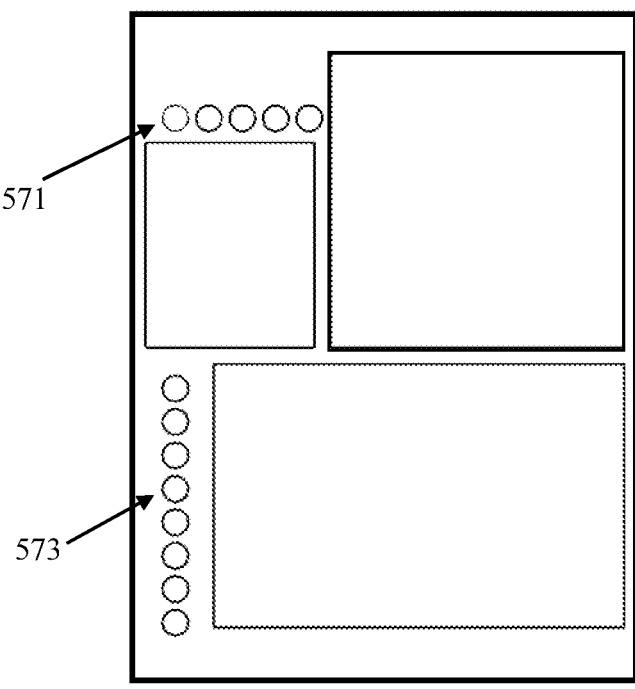

In block 414, referring now to FIG. 5G (a top view), a first plurality of via holes 571 adjacent an edge of first MOSFET chip and a second plurality of via holes 573 adjacent an edge of the second MOSFET chip are drilled through the chip-level molding layer 516 to reach the middle RDL 540 after releasing the assembly from the second carrier of the step in block 404 and backside grinding to a target thickness. The first plurality of via holes 571 are aligned with the power input area Vin and the second plurality of via holes 573 are aligned with the first source area S1 extending beyond the first MOSFET chip. After filling the via holes and singulation, the filled first plurality of via holes 571 become the first plurality of top vias 371 of FIG. 3G and the filled second plurality of via holes 573 become the second plurality of top vias 373 of FIG. 3G. Block 414 may be followed by block 416.

Figure 5H:
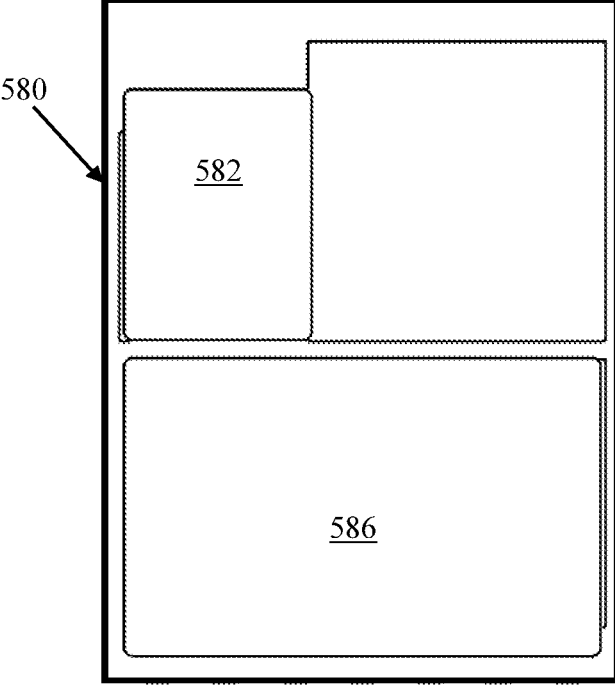

In block 416, referring now to FIG. 5H (a top view), a top RDL 580 of thickness between 40-150 microns is formed. In the same process, a first plurality of vias are formed by filling conductor inside the first plurality of via holes 571 of FIG. 5G, and a second plurality of vias are formed by filling conductor inside the second plurality of via holes 573 of FIG. 5G. The top RDL 580 including a first copper plate 582 and a second copper plate 586. The first copper plate 582 covers both the drain region of the first MOSFET chip and the first plurality of vias, thus establishing electrical connection between the drain of the first MOSFET chip to the power input Vin. The second copper plate 586 covers both the drain region of the second MOSFET chip and the second plurality of vias, thus establishing electrical connection between the drain of the second MOSFET chip to the source electrode of the first MOSFET chip. The top RDL 580 is formed by standard process of applying seed layer, photolithography, copper plating, stripping, and etching. Block 416 may be followed by block 418.

Figure 5I:
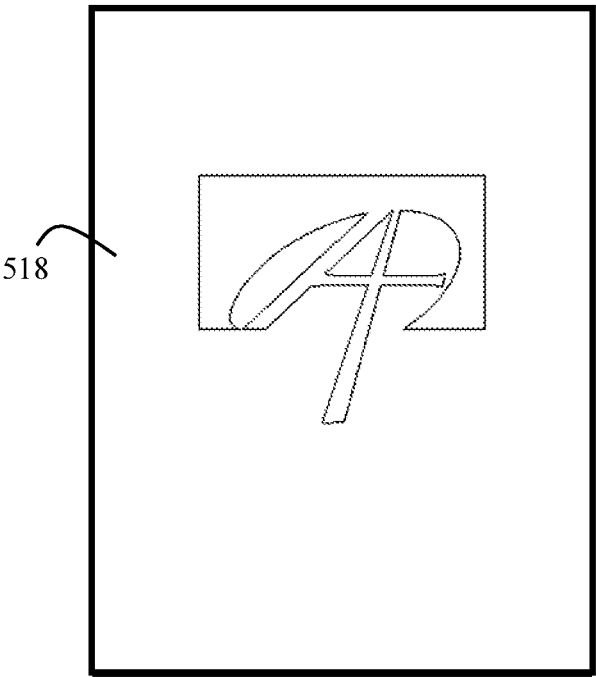

In block 418, referring now to FIG. 5I (a top view), a top-level molding layer 518 is formed. Apply backside grinding and marking processes. Block 418 may be followed by a singulation process.

Those of ordinary skill in the art may recognize that modifications of the embodiments disclosed herein are possible. For example, a number of the chips in a semiconductor package may vary. Other modifications may occur to those of ordinary skill in this art, and all such modifications are deemed to fall within the purview of the present invention, as defined by the claims.

The invention claimed is:

1. A semiconductor package comprising:
two or more chips comprising:
a first chip; and
a second chip;
a first molding layer;
a second molding layer, a bottom surface of the second molding layer directly contacting a top surface of the first molding layer;
a third molding layer, a bottom surface of the third molding layer directly contacting a top surface of the second molding layer;
a fourth molding layer, a bottom surface of the fourth molding layer directly contacting a top surface of the third molding layer;
a bottom redistribution layer (RDL) comprising a power input pin, a switching pin and a ground pin, a bottom surface of the bottom RDL exposed from a bottom of the first molding layer, and a top surface of the bottom RDL interfacing a bottom surface of the second molding layer;

a middle RDL, a bottom surface of the middle RDL directly contacting the second molding layer, and a top surface of the middle RDL interfacing a bottom surface of the third molding layer; and
a top RDL, a bottom surface of the top RDL interfacing a top surface of the third molding layer.

2. The semiconductor package of claim 1, wherein at least one of the first chip and the second chip comprises a first front surface electrode electrically connected to the ground pin and a back surface electrode electrically connected to the switching pin.

3. The semiconductor package of claim 1, wherein the top RDL comprises a copper plate covering substantially an entire back surface of at least one of the first chip and the second chip comprising a back surface electrode electrically connected to a switching pin, wherein the copper plate connects to a plurality of vias connected to the switching pin.

4. The semiconductor package of claim 3, wherein the two or more chips further comprises a third chip comprising a plurality of front surface electrodes connected to the middle RDL.

5. The semiconductor package of claim 1, wherein the first chip comprises
a first front surface electrode electrically connected to the switching pin, and
a back surface electrode electrically connected to the power input pin; and
wherein the second chip comprises
a first front surface electrode electrically connected to the ground pin, and
a back surface electrode electrically connected to the switching pin.

6. The semiconductor package of claim 5,
wherein the top RDL comprises:
a first copper plate; and
a second copper plate;
wherein the first copper plate covers substantially an entire back surface of the first chip and connects to a first plurality of vias connected to the power input pin; and
wherein the second copper plate covers substantially an entire back surface of the second chip and connects to a second plurality of vias connected to the switching pin.

7. The semiconductor package of claim 6,
wherein a top surface of the first copper plate is covered by the fourth molding layer; and
wherein a top surface of the second copper plate is covered by the fourth molding layer.

8. The semiconductor package of claim 6, wherein
the first plurality of vias are arranged along a first direction; and
the second plurality of vias are arranged along a second direction perpendicular to the first direction.

9. The semiconductor package of claim 5, wherein the two or more chips further comprise a third chip; wherein a sum of a front surface area of the first chip, a front surface area of the second chip, and a front surface area of the third chip is at least 67% of a top surface area of the semiconductor package.

10. The semiconductor package of claim 5, wherein the semiconductor package is a DC-DC buck converter.

11. The semiconductor package of claim 5, wherein the semiconductor package is a quad flat no-lead (QFN) package.

12. A semiconductor package comprising:

two or more chips comprising:

a first chip; and a second chip;

a first molding layer;

a second molding layer, a bottom surface of the second molding layer directly contacting a top surface of the first molding layer;

a third molding layer, a bottom surface of the third molding layer directly contacting a top surface of the second molding layer;

a fourth molding layer, a bottom surface of the fourth molding layer directly contacting a top surface of the third molding layer;

a bottom redistribution layer (RDL) comprising a power input pin, a switching pin and a ground pin, a bottom surface of the bottom RDL exposed from a bottom of the first molding layer, and a top surface of the bottom RDL interfacing a bottom surface of the second molding layer;

a middle RDL, a bottom surface of the middle RDL directly contacting the second molding layer, and a top surface of the middle RDL interfacing a bottom surface of the third molding layer; and a top RDL, a bottom surface of the top RDL interfacing a top surface of the third molding layer;

wherein the two or more chips are embedded in the third molding layer;

wherein a respective front surface of each of the two or more chips interfaces the second molding layer; and wherein a respective back surface of each of the two or more chips interfaces the fourth molding layer.

13. The semiconductor package of claim 12, wherein each of the first molding layer, the second molding layer, the third molding layer, and the fourth molding layer comprises a same molding compound with a same filler.

14. The semiconductor package of claim 12, wherein each of the first molding layer, the second molding layer, the third molding layer, and the fourth molding layer comprises a different filler material from other molding layers.

15. The semiconductor package of claim 12, wherein each of the first molding layer, the second molding layer, the third molding layer, and the fourth molding layer comprises a same molding compound with a same filler; and wherein each of the first molding layer, the second molding layer, the third molding layer, and the fourth molding layer comprises different percentage amount of filler from other molding layers.

16. The semiconductor package of claim 12, wherein bottom RDL further comprises a bottom half-etched portion enclosed inside the first molding layer; and wherein a total area of the bottom surface of the bottom RDL exposed from the bottom of the first molding layer is less than a total area of the top surface of the bottom RDL interfacing the bottom surface of the second molding layer.

17. The semiconductor package of claim 12, wherein a top surface of the top RDL is exposed and coplanar to a top surface of the fourth molding layer.

18. The semiconductor package of claim 12, wherein the semiconductor package is a DC-DC buck converter.

19. The semiconductor package of claim 12, wherein the semiconductor package is a quad flat no-lead (QFN) package.

20. A semiconductor package comprising:

two or more metal-oxide-semiconductor field-effect transistor (MOSFET) chips comprising:

a first MOSFET chip comprising:

a source electrode and a gate electrode on a front surface of the first MOSFET chip, and a drain electrode on a back surface of the first MOSFET chip; and a second MOSFET chip comprising:

a source electrode and a gate electrode on a front surface of the second MOSFET chip, and a drain electrode on a back surface of the second MOSFET chip;

a first molding layer;

a second molding layer, a bottom surface of the second molding layer directly contacting a top surface of the first molding layer;

a third molding layer, a bottom surface of the third molding layer directly contacting a top surface of the second molding layer;

a fourth molding layer, a bottom surface of the fourth molding layer directly contacting a top surface of the third molding layer;

a bottom redistribution layer (RDL) comprising a power input pin, a switching pin and a ground pin, a bottom surface of the bottom RDL exposed from a bottom of the first molding layer, and a top surface of the bottom RDL interfacing a bottom surface of the second molding layer;

a middle RDL, a bottom surface of the middle RDL directly contacting the second molding layer, and a top surface of the middle RDL interfacing a bottom surface of the third molding layer; and a top RDL, a bottom surface of the top RDL interfacing a top surface of the third molding layer; and wherein the semiconductor package is a DC-DC buck converter.

* * * * *